US012543267B2

(12) United States Patent
Weidinger et al.

(10) Patent No.: US 12,543,267 B2
(45) Date of Patent: Feb. 3, 2026

(54) MAGNETIC INLAY WITH AN ADJUSTABLE INDUCTANCE VALUE FOR A COMPONENT CARRIER AND A MANUFACTURING METHOD

(71) Applicant: AT&S Austria Technologie & Systemtechnik Aktiengesellschaft, Leoben (AT)

(72) Inventors: Gerald Weidinger, Leoben (AT); Ivan Salkovic, Zagreb (HR); Markus Kastelic, Zeltweg (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 802 days.

(21) Appl. No.: 17/663,386

(22) Filed: May 13, 2022

(65) Prior Publication Data

US 2022/0377895 A1 Nov. 24, 2022

(30) Foreign Application Priority Data

May 18, 2021 (EP) .................................... 21174502

(51) Int. Cl.
*H05K 1/16* (2006.01)
*H01F 17/00* (2006.01)
(Continued)

(52) U.S. Cl.
CPC .......... *H05K 1/165* (2013.01); *H01F 17/0013* (2013.01); *H01F 27/2847* (2013.01);
(Continued)

(58) Field of Classification Search
CPC ...... H05K 1/165; H05K 1/113; H05K 3/4644; H05K 2201/09509; H01F 17/0013; H01F 27/2847; H01F 41/046
See application file for complete search history.

(56) References Cited

U.S. PATENT DOCUMENTS 11,527,342 B2 * 12/2022 Arai ......................... H01F 27/24
11,551,856 B2 * 1/2023 Tokunaga ................ H01F 17/04
(Continued)

FOREIGN PATENT DOCUMENTS

CN 107004612 A 8/2017
CN 107068576 A 8/2017
(Continued)

OTHER PUBLICATIONS

Brächer, T.; Extended European Search Report in Application No. 21174502.1; pp. 1-12; Nov. 18, 2021; European Patent Office; 80298 Munich, Germany.
(Continued)

*Primary Examiner* — Malcolm Barnes
(74) *Attorney, Agent, or Firm* — Robert A. Blaha; Smith Tempel Blaha LLC

(57) ABSTRACT

A magnetic inlay for a component carrier includes a magnetic matrix and an electrically conductive structure embedded horizontally in the magnetic matrix. The electrically conductive structure is configured as an inductive element. The magnetic inlay is configured so that, depending on the geometrical properties of the electrically conductive structure, a specific inductance value is provided for the magnetic inlay.

20 Claims, 3 Drawing Sheets

(51) Int. Cl.
*H01F 27/28* (2006.01)
*H01F 41/04* (2006.01)
*H05K 1/09* (2006.01)
*H05K 1/11* (2006.01)
*H05K 3/46* (2006.01)

(52) U.S. Cl.
CPC ........... *H01F 41/046* (2013.01); *H05K 1/113* (2013.01); *H05K 3/4644* (2013.01); *H05K 2201/09509* (2013.01)

(56) References Cited

U.S. PATENT DOCUMENTS

| | | | |
|---|---|---|---|
| 2006/0152321 A1 | 7/2006 | Jung et al. | |
| 2009/0045905 A1* | 2/2009 | Nakagawa | H01F 17/0006 336/232 |
| 2010/0259351 A1* | 10/2010 | Bogert | H01F 5/003 336/200 |
| 2017/0098997 A1* | 4/2017 | Hamada | H01F 17/0013 |
| 2018/0310408 A1* | 10/2018 | Hamada | H02M 3/003 |
| 2019/0045624 A1* | 2/2019 | Weidinger | H05K 1/0224 |
| 2019/0115150 A1* | 4/2019 | Yoshioka | H01F 41/046 |

FOREIGN PATENT DOCUMENTS

| | | |
|---|---|---|
| CN | 109392238 A | 2/2019 |
| CN | 111757589 A | 10/2020 |
| EP | 0 878 984 B1 | 11/2004 |
| JP | 2008041833 A | 2/2008 |

OTHER PUBLICATIONS

First Office Action in Patent Application No. 202210545883.9; Dec. 3, 2025, pp. 1-9; China National Intellectual Property Administration; No. 6 Xitucheng Road, ☐Haidian District, Beijing, P.R.China, 10088.

English translation of First Office Action in Patent Application No. 202210545883.9; Dec. 3, 2025, pp. 1-9; China National Intellectual Property Administration; No. 6 Xitucheng Road, ☐Haidian District, Beijing, P.R.China, 100088.

* cited by examiner

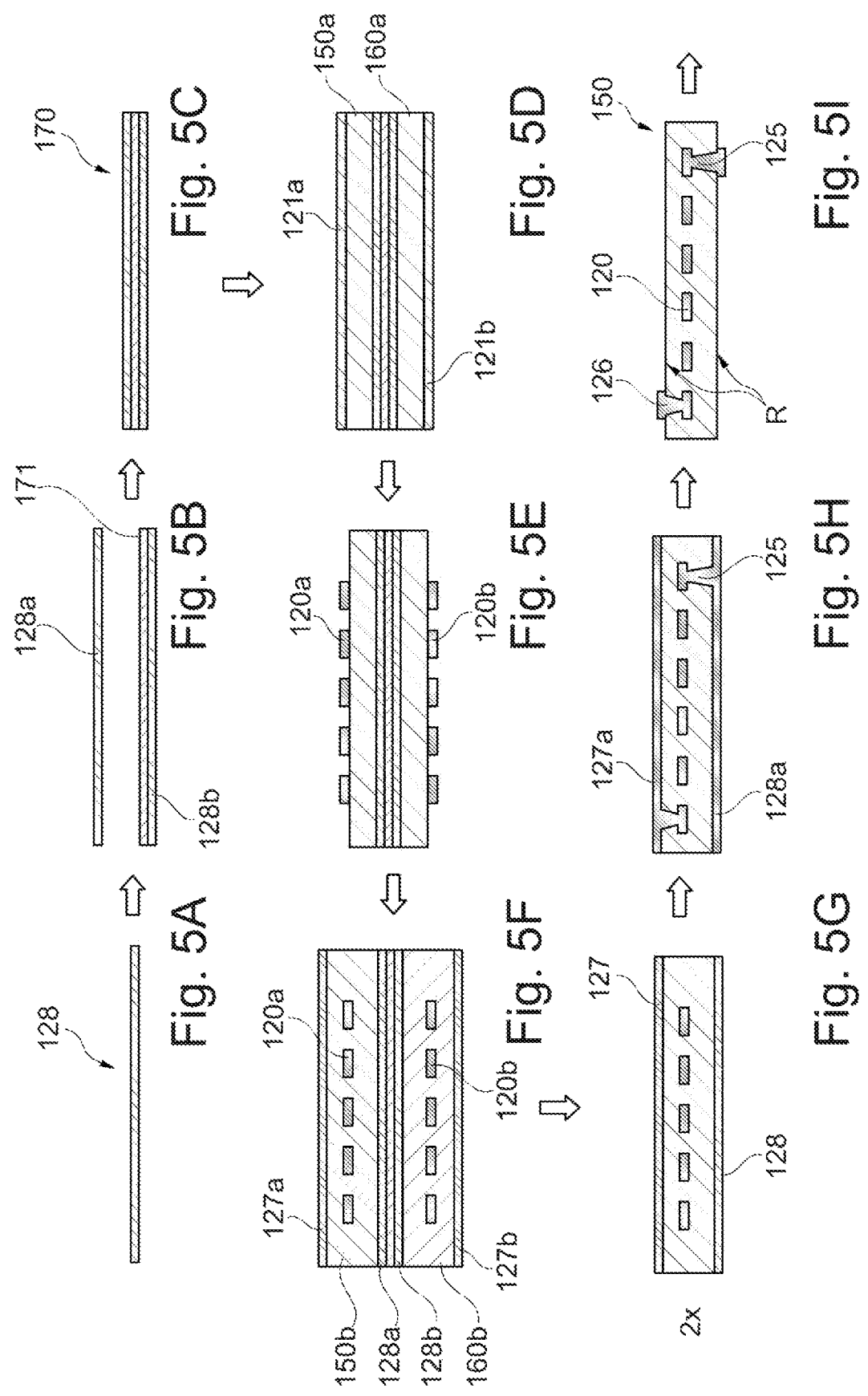

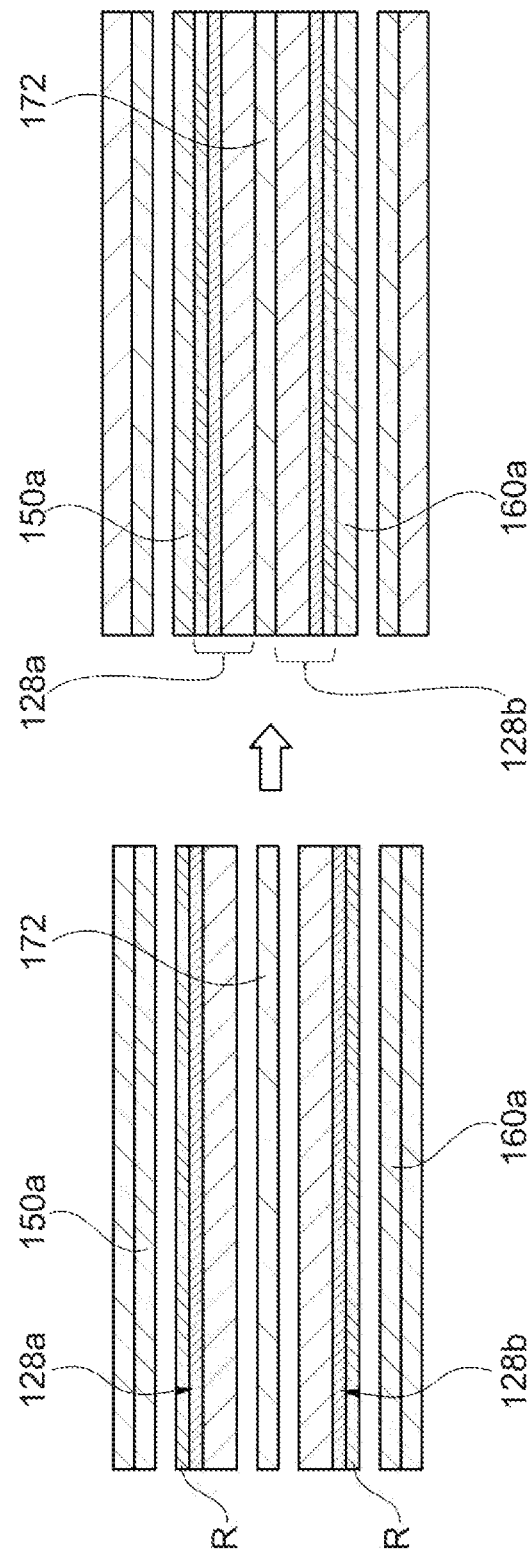

MAGNETIC INLAY WITH AN ADJUSTABLE INDUCTANCE VALUE FOR A COMPONENT CARRIER AND A MANUFACTURING METHOD

CROSS-REFERENCE TO RELATED APPLICATIONS

This application claims the benefit of the filing date of European Patent Application No. 21174502.1, filed May 18, 2021, the disclosure of which is hereby incorporated herein by reference.

TECHNICAL FIELD

Embodiments of the present invention relate to a magnetic inlay, a component carrier, and a method of manufacturing a component carrier.

TECHNOLOGICAL BACKGROUND

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. Also an efficient protection against electromagnetic interference (EMI) becomes an increasing issue. At the same time, component carriers shall be mechanically robust and electrically and magnetically reliable so as to be operable even under harsh conditions.

Moreover, an extended functionality of component carriers is demanded by users. For example, it is known to integrate magnetic material in a component carrier in order to provide/enhance an inductance for specific applications. However, conventional approaches may suffer from low inductance values and high production costs.

SUMMARY

There may be a need to provide a large (in particular adjustable) magnetically enhanced inductance for a component carrier in a cost-efficient manner.

A magnetic inlay, a component carrier, a method of manufacturing, and a method of adjusting the inductance value according to the independent claims are provided.

According to an aspect of the disclosure a magnetic inlay is described, comprising:
i) a magnetic matrix (e.g., a magnetic sheet), and
ii) at least one (in particular two or more) electrically conductive structure (e.g., a copper trace) embedded (horizontally (i.e., (essentially) parallel with the directions of main extension of the magnetic inlay)) in the magnetic matrix, wherein the electrically conductive structure is configured as an inductive element (e.g., shaped as windings and/or coil).

The magnetic inlay is configured so that, depending on the (geometrical) properties (e.g., thickness and the shape (e.g., rectangular/circular windings, number of turns)) of the electrically conductive structure, a specific inductance value (inductance per area, in particular in the range 10 to 10000 $nH/mm^2$) is provided for the magnetic inlay ("tunable inductance").

According to a further aspect of the disclosure, a component carrier is described, comprising:
i) a (layer) stack comprising at least one electrically conductive layer structure and/or at least one electrically insulating layer structure, and
ii) a magnetic inlay as described above, wherein the magnetic inlay is assembled (e.g., embedded or surface mounted) to the stack.

According to a further aspect of the disclosure, a method of manufacturing a magnetic inlay (in particular as described above) for a component carrier is provided. The method comprising:
i) providing a temporary carrier,
ii) arranging a first magnetic element on a first side of the temporary carrier,
iii) arranging a second magnetic element on a second side, being opposed to the first side, of the temporary carrier,
iv) arranging (in particular laminating and structuring) a first electrically conductive structure on the first magnetic element,
v) arranging (in particular laminating and structuring) a second electrically conductive structure on the second magnetic element,
vi) arranging a further first magnetic element on the first magnetic element, thereby enclosing (embedding, encapsulating) the first electrically conductive structure,
viii) arranging a further second magnetic element on the second magnetic element, thereby enclosing (embedding, encapsulating) the second electrically conductive structure,
ix) separating a first magnetic inlay from the first side of the temporary carrier, and
x) separating a second magnetic inlay from the second side of the temporary carrier.

According to a further aspect of the disclosure, it is described a method of adjusting (tuning) the inductance of a magnetic inlay (e.g., as described above) for a component carrier to a specific inductance value, the method comprising:
i) providing a first magnetic element (in particular a first magnetic matrix like a sheet),
ii) providing an electrically conductive structure that is configured as an inductive element, hereby determining specific geometrical properties (in particular a specific thickness and/or a specific shape) for the electrically conductive structure that correspond to the specific inductance value,
iii) arranging the electrically conductive structure on or in the first magnetic element,
iv) arranging a second magnetic element (in particular a second magnetic matrix) on the first magnetic element, thereby enclosing the electrically conductive structure in magnetic material (of the magnetic elements) to obtain the magnetic inlay with the specific inductance value.

Overview of Embodiments

In the context of the present document, the term "magnetic matrix" may in particular refer to a base material (base substance) that comprises magnetic properties. The base material may be magnetic itself or magnetic particles may be distributed within a non-magnetic matrix material. The magnetic matrix may be configured for example rigid/solid (e.g., as magnetic sheets), viscous (magnetic paste), or magnetic resin (viscous/liquid). The magnetic matrix may comprise electrically conductive material/particles and/or electrically insulating material/particles. Further, the magnetic matrix may be configured to have a relative magnetic permeability $\mu_r$ in a range from 2 to $10^6$, in particular 20 to 80. A plurality of different materials may be considered suitable to provide the base material and/or the embedded particles of the magnetic matrix, for example a ferromagnetic material (like iron), a ferrimagnetic material (like ferrite), a permanent magnetic material, a soft magnetic material, a metal oxide. In an example, a dielectric (resin) matrix with magnetic particles therein is used. In another example, magnetic sheets are applied that comprise magnetic particles embedded in a fiber-enforced resin (e.g., prepreg). In a further example, a magnetic paste is used that comprises magnetic particles embedded in a not fiber-enforced resin. In a further example, the magnetic matrix is arranged in the inlay in a planar manner.

In the context of the present document, the term "inlay" may refer to a separate component/element that is manufactured in an inlay manufacturing process being (essentially) independent from the component carrier manufacturing process. The inlay may be configured to be surface mounted on or embedded in said component carrier. However, the inlay may be produced, sold, and shipped completely independent of the component carrier. Nevertheless, in an embodiment, the manufacturing process of magnetic inlay and component carrier may be intertwined. The inlay may also be termed "inductor component" and may particularly denote a stand-alone electronic member which provides an inductance in the framework of an electronic application in which the inductor component is implemented. The inlay may be formed on the basis of component carrier technology, in particular on the basis of printed circuit board (PCB) technology, and may be surface-mounted or embedded in a separately formed component carrier such as a PCB. However, the inlay component may also be used in conjunction with non-component carrier applications.

The magnetic inlay may be essentially shaped as a plate, meaning that it comprises two directions of main extension along the x- and y-axes and a comparably short extension along the z-axis. In this context, the term "horizontal" may thus mean "oriented in parallel with a direction of main extension", while the term "vertical" may mean "oriented perpendicular to the directions of main extension". Hence, even if the inlay is turned around, the terms "vertical" and "horizontal" always have the same meaning. Further, the magnetic inlay may comprise different shapes, for example one of circular, rectangular, polygonal.

In a preferred embodiment, the magnetic inlay comprises the magnetic matrix and an electrically conductive structure (e.g., a copper trace) that is (at least partially) (in particular fully) embedded in the magnetic matrix to provide the inductive element. Thereby, a planar inductive element may be provided in an efficient, robust, and cost-saving manner. The magnetic matrix may encapsulate (fully) the electrically conductive structure and thus significantly increase the inductance value. Using a magnetic inlay assembled to a component carrier, a large amount of magnetic material may be applied, which may lead in turn to the high inductance value.

In the context of the present document, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, a metal core substrate, an inorganic substrate and an IC (integrated circuit) substrate. A component carrier may also be a hybrid board combining different ones of the above-mentioned types of component carriers.

In the context of the present document, the term "adjusting an inductance value" may in particular denote an intentional step of determining physical properties that may result in a magnetic inlay with a specific (desired) inductance value. For example, an electrically conductive structure that serves as an inductive element may be designed with the intention to provide a specific inductance value. For example, an adjustable property of the electrically conductive structure (e.g., a copper trace) may be the thickness. In a preferred example, the magnetic inlay comprises a planar shape and the electrically conductive structure may also be arranged in a planar manner therein. Accordingly, the thickness of conductive material may be an important parameter to obtain a specific inductance value. Further, the shape of the electrically conductive structure may be another important parameter to provide the specific inductance. For example, the conductive structure may comprise windings in a circular/round or rectangular form. Furthermore, the number of windings may be varied and fixed to a specific number of turns. In another example, the magnetic permeability of the magnetic matrix may be determined such that the specific inductance value may be adjusted.

According to an exemplary embodiment, the disclosure may be based on the idea that a magnetic inductance for a component carrier can be provided in an efficient and robust manner, when a magnetic inlay is used that comprises a magnetic matrix with an embedded electrically conductive structure (configured as an inductive element), wherein the inductance value is adjusted based on specific design parameters of the electrically conductive structure.

It has now been surprisingly found by the inventors that a high inductance value can be achieved in a design-flexible manner, when the inductance of a magnetic inlay is tuned by applying specific (geometrical) properties. In this respect, the inventors found that in particular the parameters thickness and shape of the inductive element (in particular in interplay with the magnetic permeability of the magnetic matrix material) may enable the adjustment of a specific inductance value.

In an example of the disclosure, it may be possible to achieve high inductance values, even though the magnetic inlay can be applied in an easy, efficient and robust manner. For example, the inlay may be designed in a planar manner with a thickness of only around 100 μm. Such a small component may be assembled to a component carrier in a very design flexible manner and be versatile in a plurality of different applications. For example, the assembly of the inlay may be directly integrated into the component carrier manufacturing (build-up) process.

The main surfaces of the magnetic inlay may comprise rough surfaces which may directly reflect the inventive manufacturing method on two opposite sides of a temporary carrier. Said temporary carrier may comprise electrically conductive layers (in particular copper layers) on two opposed sides and two inlays may be efficiently produced at the same time in the same process at said two opposed sides, respectively. Further build-up may yield the electrically conductive structure and electrically conductive surface pads. Hereby, the electrically conductive layers (e.g., copper foils) may cause a surface roughing of the magnetic material of the magnetic inlay.

According to an embodiment, an upper main surface and/or a lower main surface (being opposed to the upper main surface), of the magnetic matrix may comprise a rough surface. In particular, this rough surface may reflect a manufacturing step (see description of the method below) of arranging one or more electrically conductive layer(s) (e.g., a copper layer) on the magnetic matrix.

According to a further embodiment, the magnetic inlay is shaped as a plate, in particular comprises a planar shape. This may provide the advantage that the magnetic inlay may be assembled in an easy and robust manner to a component carrier. Since a component carrier is in general also plate-shaped, the directions of main extension of magnetic inlay and component carrier may be aligned. This may be done by surface-mounting (e.g., directly placing the magnetic inlay onto a component carrier main surface) or embedding (e.g., directly into a component carrier core layer structure (see FIG. 2) or in parallel with vertical through connections of the component carrier (see FIG. 4)).

According to a further embodiment, the magnetic inlay comprises a thickness of 2 mm or less, in particular 1 mm or less, in particular 200 μm or less, in particular 150 μm or less, more in particular 100 μm or less, more in particular 75 μm or less, more in particular 50 μm or less, more in particular 20 μm or higher. According to a further embodiment, the magnetic inlay comprises a thickness in the range between 20 μm and 2 mm.

Thus, a surprisingly thin (ultra-thin) magnetic inlay may be obtained that, nevertheless, provides large inductance values. Due to the ultra-thin design, the magnetic inlay may be assembled to a component carrier in a very design-flexible manner depending on desired applications.

According to a further embodiment, the electrically conductive structure is arranged in the center of the magnetic inlay (in particular with respect to the vertical direction z). In other words, the electrically conductive structure is arranged in the middle of the magnetic inlay/matrix in the horizontal direction (along x- and y-axes) and/or in the vertical direction (along z-direction). In this manner, a specifically efficient inductance value and stability may be provided.

According to a further embodiment, the electrically conductive structure comprises windings, in particular a coil-like shape. This may provide the advantage that an inductance may be easily provided merely by the form of the electrically conductive structure (e.g., square, hexagonal, octagonal, circular).

In the context of the present document, the term "winding" may particularly denote a loop structure (which may be similar to a helical structure with corners), wherein multiple of such loops may form a coil-type arrangement. However, due to the component carrier manufacturing technology (for instance involving lamination) of the magnetic inlay and/or due to the used component carrier raw materials (for instance involving planar constituents such as plates and foils), the windings of the coil (like) structure may have edge-like or corner-like portions rather than being limited to a composition of multiple interconnected purely circular structures.

According to a further embodiment, the directions of main extension (length x and width y) of the windings are (essentially) parallel to the directions of main direction (length x and width y) of the magnetic inlay (and/or the component carrier, when the magnetic inlay has been assembled).

According to a further embodiment, the electrically conductive structure comprises a number of windings in the range between two and one hundred, in particular between three and eight. In a specific example, it has been surprisingly turned out that a number of windings in this range may resemble an efficient compromise between large inductance value and manufacture costs.

According to a further embodiment, the windings of the electrically conductive structure comprise one of a rectangular shape, a round shape, a polygonal shape, a spiral shape (in particular a spiral that is rectangular/squared or circular). Hence, the design flexibility, when determining the shape of the electrically conductive structure, may be considered advantageously high. In a specific example, a rectangular shape (see e.g., FIG. 3), together with a number of turns in the range two to one hundred, in particular three to eight, may yield an especially advantageous inductance value.

According to a further embodiment, the magnetic inlay further comprises at least one electrically conductive via, being a blind via or a through-hole via, that extends at least partially through the magnetic matrix, and that connects the electrically conductive structure to an exterior surface of the magnetic inlay. In this manner, a reliable electric connection can be provided.

In the context of the present document, the term "via" (vertical interconnection access) may refer to an electrical connection between layers in a physical electronic circuit that goes through the plane of one or more adjacent layers. The term via may include through-hole vias, buried vias, and blind vias. While vias may be used to connect only a few layers (in a stack) with each other, a "plated through hole" may be used to connect all layers of a stack. Microvias are used as interconnects between layers in high density interconnect (HDI) substrates and printed circuit boards (PCBs) to accommodate the high I/O density of advanced packages. In the present document, an electrically conductive through connection may be called a via.

According to a further embodiment, the at least one electrically conductive via is filled at least partially (in particular fully) with electrically conductive material. Thereby, the holes of the inlay can be manufactured (e.g., mechanically drilled) using established and standardized PCB methodology such as via formation. A metal-filled via may be considered more robust and stable than an unfilled via.

According to a further embodiment, the at least one (electrically conductive) via is a hollow lining which is filled at least partially with an electrically insulating material, in particular a resin. This may provide the advantage that the through connection is more robust/stable and/or can be designed in a flexible manner regarding different functionalities. For example, the hole may be drilled through the magnetic matrix and then, the sidewalls of the hole are plated with conductive material (e.g., copper). Afterwards, the hollow lining (cavity) can be filled partially or completely with an insulating material, for example resin such as insulator ink.

According to a further embodiment, at least one of the vias is a circular (cylindrical) or frustoconical hole.

According to a further embodiment, the magnetic matrix continuously fills a volume around the electrically conductive structure (and between windings of the electrically conductive structure (see e.g., FIG. 3)). This may provide the advantage that the electrically conductive structure is enclosed in a stable and robust manner. Further, this may provide the advantage that a high amount of magnetic material can be applied, and an accordingly high inductance can be achieved. The described (planar) magnetic inlay/matrix may allow for applying a high amount of magnetic matrix (that fills all the space between the vias).

According to a further embodiment, the magnetic matrix comprises at least one of the group consisting of a rigid solid, and a paste. Depending on the desired functionality, different configurations of the magnetic matrix may be especially suitable. For example, the magnetic matrix may be configured as a magnetic sheet (rigid) that can be laminated. In this example, the magnetic matrix may comprise a prepreg or another resin with embedded magnetic particles. In another example, the magnetic matrix may be configured as a magnetic paste (viscous) that could be filled/poured in a mold to manufacture the magnetic element.

According to a further embodiment, the magnetic matrix comprises one of the group which consists of: electrically conductive, electrically insulating, partially electrically conductive and partially electrically insulating (e.g., a first electrically conductive part and a second electrically insulating part). Depending on the desired functionality, different configurations of the magnetic matrix may be especially suitable.

According to a further embodiment, the relative magnetic permeability $\mu_r$ of the magnetic matrix is in a range from 2 to $10^6$, in particular 2 to 1000, more in particular 2 to 100, more in particular 20 to 80, more in particular around 50. These values are comparably high and can lead to an advantageously high inductance value. Permeability is the measure of magnetization that a material obtains in response to an applied magnetic field. The relative permeability, denoted by the symbol $\mu_r$, is the ratio of the permeability of a specific medium u to the permeability of free space po (vacuum).

According to a further embodiment, the magnetic matrix comprises at least one material of the group consisting of a ferromagnetic material (e.g., iron, nickel), a ferrimagnetic material, a permanent magnetic material, a soft magnetic material, a ferrite, a metal oxide (e.g., magnetite), a dielectric matrix (e.g., a resin), in particular a prepreg, with magnetic particles therein, and an alloy, in particular an iron alloy or alloyed silicon. Thereby, established materials can be directly applied to manufacture the magnetic matrix in a cost-efficient manner.

A permanent magnetic material may be ferromagnetic material or ferrimagnetic material, and may for instance be provided on the basis of transition metals (with partially filled 3d shell) such as iron or nickel, or on the basis of rare earths (with partially filled 4f shell).

A soft magnetic material may be a material which can be easily re-magnetized, i.e., having a small area of its hysteresis curve. In other words, soft magnetic materials are those materials that are easily magnetized and demagnetized. They may have intrinsic coercivity less than 1000 $Am^{-1}$.

A ferrite may be denoted as a type of ceramic compound composed of $Fe_2O_3$ combined chemically with one or more additional metallic elements. Ferrites are both electrically non-conductive and ferrimagnetic, so they can be magnetized or attracted by a magnet. Ferrites may be implemented as hard ferrites or soft ferrites, depending on the application.

According to a further embodiment, the magnetic inlay is embedded in the stack. According to a further embodiment, the magnetic inlay is surface mounted on the stack.

The magnetic inlay may be a separate component compared with the component carrier and is manufactured in a separate process. Thus, the inlay may be considered as a flexibly usable element (yet a finished product) that can be integrated in the component carrier (not yet a finished product) manufacturing process. Depending on the desired functionality, the inlay can be efficiently embedded in a cavity of the component carrier (e.g., encapsulated in resin such as prepreg) or be surface mounted on a main surface of the component carrier (e.g., using an adhesive). While embedding may be considered as a robust protection of the inlay, surface mounting may facilitate electric connections to the inlay.

According to a further embodiment, at least one electrically conductive structure of the stack is electrically connected to the electrically conductive structure of the magnetic inlay. This may provide the advantage that the electrically conductive structures of the inlay can be directly coupled/connected with the electrically conductive structures of the component carrier. While conventionally, through holes of the component carrier had to be equipped in a cumbersome manner with magnetic material, the described inlay enables an easy, yet robust, integration and electrical connection. For example, electrically conductive vias of the component carrier may be electrically connected to horizontally oriented electrically conductive pads (traces) of the magnetic inlay.

According to a further embodiment, the at least one electrically conductive layer structure is electrically coupled with at least one electrically conductive via to the stack. Thereby, the electrically conductive structure may be embedded in a stable and robust manner in the magnetic matrix, while an efficient electrical connection to (electrically conductive layer structures such as vias) of the stack is enabled.

According to a further embodiment, the magnetic inlay is assembled to the stack, so that the directions of main extension (x, y) of the magnetic inlay are (essentially) parallel to the directions of main extension (x, y) of the component carrier. In other words, the magnetic inlay is embedded or surface mounted horizontally.

In case that the magnetic inlay and the component carrier are plate-shaped (in particular planar), they may be oriented parallel with respect to each other. This may provide the advantage of a high inductance value (see above) that can be provided in an easy manner. It should be noted that the magnetic field of a horizontally (planar) oriented magnetic inlay may be perpendicular to a magnetic field of a conventional coaxial winding (with respect to the component carrier).

According to a further embodiment, the magnetic inlay is assembled to the stack, so that a direction of main extension (x) of the magnetic inlay is (essentially) perpendicular to a direction a main extension (x) of the component carrier (while a direction of non-main extension (z) of the magnetic inlay may be oriented in parallel with the component carrier direction of main extension (x). In other words, the magnetic inlay is embedded or surface mounted vertically.

This embodiment may provide the advantage that the magnetic inlay (or a plurality of magnetic inlays) may be arranged in a robust manner within (e.g., a core structure) of the stack. The inlay(s) may be arranged in parallel with electrically conductive (through) vias of the component carrier (stack) and an electrical contact may be established by blind vias of the component carrier. Such vertically oriented magnetic inlays may be further electrically connected with each other (e.g., to provide a further coil). In a specific example, it may be taken into account that the magnetic flux from the first inlay does not cancel the magnetic flux of the second inlay due to opposite coil direction (current flow).

According to a further embodiment, the method further comprises: arranging a top first electrically conductive layer on the further first magnetic element and/or arranging a top second electrically conductive layer on the further second magnetic element. This may provide the advantage that electrically conductive structures (e.g., pads) on the magnetic inlay/matrix can be provided efficiently within the inlay manufacturing process. Electrically conductive layers (in particular copper foils) may be patterned by established means to obtain the traces. Since a copper foil may comprise a smooth (shiny) surface and a rough (treated) surface and the rough surface may be placed on the magnetic matrix (in another example, the smooth surface may be placed on the magnetic matrix), this process step may be reflected in the final magnetic inlay product by a rough magnetic matrix/inlay surface.

According to a further embodiment, arranging comprises structuring by removing electrically conductive material, thereby exposing an upper main surface of the respective magnetic element, wherein the upper main surface of the respective magnetic element comprises a rough surface. As described above, electrically conductive layers such as copper foils may comprise a rough surface that leave (after removal) a rough surface on the magnetic matrix.

According to a further embodiment, the temporary carrier comprises a bottom first electrically conductive layer, in particular copper, at the first side and/or a bottom second electrically conductive layer, in particular copper, at the second side. This may provide the advantage that the metal layers can be separated from the temporary carrier together with the respective magnetic elements and thereby, the metal layers may serve as a starting material for forming an electrically conductive pattern on the magnetic inlay. Electrically conductive metal layers such as copper foils may comprise a rough surface that leave (after (partial) removal) a rough surface on the magnetic matrix.

According to a further embodiment, the temporary carrier comprises an electrically insulating layer (in particular a prepreg layer or a release film), sandwiched between the first metal layer and the second metal layer. This may provide the advantage that an efficient separation is enabled, wherein the metal layers may remain at the respective magnetic inlay.

According to a further embodiment, providing the first magnetic element and/or the second magnetic element further comprises: determining a specific magnetic permeability for the first magnetic element and/or the second magnetic element in order to obtain the magnetic inlay with the specific inductance value. In a specific example, it has been surprisingly turned out that the magnetic permeability, in particular in interplay with the shape/thickness of the inductive element, may resemble an efficient means to adjust the specific inductance value.

According to a further embodiment, the rough surface comprises a plurality of protrusions, and the magnetic matrix comprises magnetic particles embedded in matrix material, wherein a first section of the plurality of protrusions comprises a first number (and/or average size) of magnetic particles, wherein a second section of the magnetic matrix (not being part of the first section and having the same size as the first section) comprises a second number (and/or average size) of magnetic particles, and wherein the second number (and/or average size) is larger than the first number (and/or average size). In other words, protrusions (the rough surface structure comprises ridges and valleys) of the rough surface may comprise less magnetic particles (or smaller magnetic particles) that a portion of the magnetic matrix with the same volume.

According to a further embodiment of the method, the first magnetic element comprises a first magnetic matrix, the second magnetic element comprises a second magnetic matrix, and the first magnetic matrix and the second magnetic matrix comprise a similar material or a different material. In this manner, there are provided different design options depending on the desired application.

In a further embodiment, the magnetic inlay may be configured for shielding electromagnetic radiation from propagating within the component carrier or within the stack (for instance from a first portion of the stack to a second portion of the stack). The magnetic inlay may however also be configured for shielding electromagnetic radiation from propagating between component carrier and an environment. Such a shielding may include a prevention of electromagnetic radiation from propagating from an exterior of the component carrier to an interior of the component carrier, from an interior of the component carrier to an exterior of the component carrier, and/or between different portions of the component carrier. In particular, such a shielding may be accomplished in a lateral direction of the stack (i.e., horizontally) and/or in a stacking direction of the stack (i.e., vertically). In such an embodiment, the magnetic inlay may function for shielding electromagnetic radiation to thereby suppress undesired effects of electromagnetic interference (EMI), in particular in the radiofrequency (RF) regime.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a bare die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming holes through the laminate, for instance by laser drilling or mechanical drilling, and by partially or fully filling them with electrically conductive material (in particular copper), thereby forming vias or any other through-hole connections. The filled hole either connects the whole stack, (through-hole connections extending through several layers or the entire stack), or the filled hole connects at least two electrically conductive layers, called via. Similarly, optical interconnections can be formed through individual layers of the stack in order to receive an electro-optical circuit board (EOCB). Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) and/or a photoimageable or dry-etchable organic material like epoxy-based build-up material (such as epoxy-based build-up film) or polymer compounds (which may or may not include photo- and/or thermosensitive molecules) like polyimide or polybenzoxazole.

In an embodiment, the at least one electrically insulating layer structure comprises at least one of the group consisting of a resin or a polymer, such as epoxy resin, cyanate ester resin, benzocyclobutene resin, bismaleimide-triazine resin, polyphenylene derivate (e.g., based on polyphenylenether, PPE), polyimide (PI), polyamide (PA), liquid crystal polymer (LCP), polytetrafluoroethylene (PTFE) and/or a combination thereof. Reinforcing structures such as webs, fibers, spheres or other kinds of filler particles, for example made of glass (multilayer glass) in order to form a composite, could be used as well. A semi-cured resin in combination with a reinforcing agent, e.g., fibers impregnated with the above-mentioned resins is called prepreg. These prepregs are often named after their properties e.g., FR4 or FR5, which describe their flame retardant properties. Although prepreg particularly FR4 are usually preferred for rigid PCBs, other materials, in particular epoxy-based build-up materials (such as build-up films) or photoimageable dielectric materials, may be used as well. For high frequency applications, high-frequency materials such as polytetrafluoroethylene, liquid crystal polymer and/or cyanate ester resins, may be preferred. Besides these polymers, low temperature cofired ceramics (LTCC) or other low, very low or ultra-low DK materials may be applied in the component carrier as electrically insulating structures.

In an embodiment, the at least one electrically conductive layer structure comprises at least one of the group consisting of copper, aluminum, nickel, silver, gold, palladium, tungsten and magnesium. Although copper is usually preferred, other materials or coated versions thereof are possible as well, in particular coated with supra-conductive material or conductive polymers, such as graphene or poly(3,4-ethylenedioxythiophene) (PEDOT), respectively.

At least one component may be embedded in the component carrier and/or may be surface mounted on the component carrier. Such a component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. An inlay can be for instance a metal block, with or without an insulating material coating (IMS-inlay), which could be either embedded or surface mounted for the purpose of facilitating heat dissipation. Suitable materials are defined according to their thermal conductivity, which should be at least 2 W/mK. Such materials are often based, but not limited to metals, metal-oxides and/or ceramics as for instance copper, aluminum oxide ($Al_2O_3$) or aluminum nitride (AlN). In order to increase the heat exchange capacity, other geometries with increased surface area are frequently used as well. Furthermore, a component can be an active electronic component (having at least one p-n-junction implemented), a passive electronic component such as a resistor, an inductance, or capacitor, an electronic chip, a storage device (for instance a DRAM or another data memory), a filter, an integrated circuit (such as field-programmable gate array (FPGA), programmable array logic (PAL), generic array logic (GAL) and complex programmable logic devices (CPLDs)), a signal processing component, a power management component (such as a field-effect transistor (FET), metal-oxide-semiconductor field-effect transistor (MOSFET), complementary metal-oxide-semiconductor (CMOS), junction field-effect transistor (JFET), or insulated-gate field-effect transistor (IGFET), all based on semiconductor materials such as silicon carbide (SiC), gallium arsenide (GaAs), gallium nitride (GaN), gallium oxide ($Ga_2O_3$), indium gallium arsenide (InGaAs) and/or any other suitable inorganic compound), an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be an IC substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such a solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable.

A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), Electroless Nickel Immersion Palladium Immersion Gold (ENIPIG), gold (in particular hard gold), chemical tin, nickel-gold, nickel-palladium, etc.

The aspects defined above and further aspects of the invention are apparent from the examples of embodiment to be described hereinafter and are explained with reference to these examples of embodiment.

BRIEF DESCRIPTION OF THE DRAWINGS

FIG. 5A, FIG. 5B, FIG. 5C, FIG. 5D, FIG. 5E, FIG. 5F, FIG. 5G, FIG. 5H and FIG. 5I illustrate a manufacturing method to provide the magnetic inlay according to an exemplary embodiment of the disclosure.

FIG. 6A and FIG. 6B show a manufacturing method to provide the magnetic inlay according to another exemplary embodiment of the disclosure.

DETAILED DESCRIPTION OF ILLUSTRATED EMBODIMENTS

Figure 1:
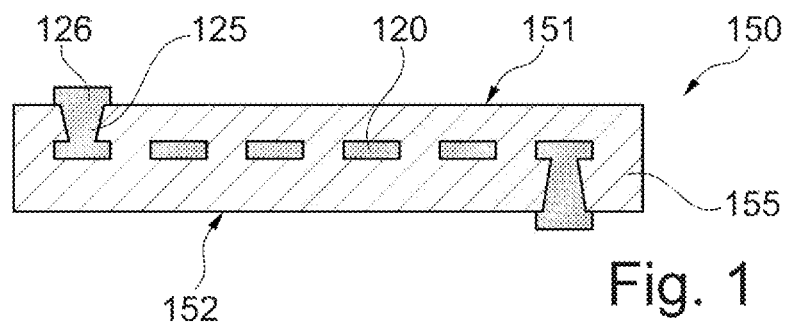
FIG. 1 shows a side view of a magnetic inlay according to an exemplary embodiment of the disclosure.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the disclosure have been developed.

According to an exemplary embodiment, it is started with a first copper foil. On the rough side of the copper foil, a release layer (temporary carrier) is printed. Then, a second copper foil is laminated onto the release layer. The construction is bond treated and magnetic sheets and copper foils are laminated to create a symmetric stack. The outer layers are structured followed by another lamination step with magnetic sheets and copper foil. The buildup is then mechanically split at the release layer to yield two identical cores. The release layer is stripped then followed by drilling, plating and structuring yielding the magnetic inlay.

According to an exemplary embodiment, a copper structure in planar inductors (magnetic inlay) is fully enclosed by magnetic material which gives high inductance density in comparison to state of the art. There is a high degree in freedom of design of the copper structure (square, hexagonal, octagonal, circular). The magnetic inlay may be ultra-thin (e.g., 100 µm) and may display high inductance values in comparison to conventional approaches. Using 2.5D technology allows the construction of a symmetric build-up. After splitting the build-up at the release layer, two sets of build-ups are created.

FIG. 1 shows a side view of a magnetic inlay 150 according to an exemplary embodiment of the disclosure. The magnetic inlay 150 comprises a magnetic matrix 155 and an electrically conductive structure 120 is embedded horizontally in the magnetic matrix 155, wherein the electrically conductive structure 120 is configured as an inductive element. An upper main surface 151 and a lower main surface 152, being opposed to the upper main surface 151, of the magnetic inlay 150 comprise a rough surface, respectively, that reflects a manufacturing step of arranging a (top and bottom) electrically conductive layers 127, 128 (see detailed discussion for FIG. 5). The magnetic inlay 150 is shaped as a plate (i.e., planar) and comprises an ultra-thin thickness (in the example shown 100 µm thick and 1000 µm in length). The electrically conductive structure 120 is arranged in the center of the magnetic inlay 150, both in the vertical direction (along the z-axis) and in the horizontal direction (along the x- and y-axes). The electrically conductive structure 120 comprises windings (see also FIG. 3). The magnetic inlay 150 further comprises electrically conductive vias 125 that extend through the magnetic matrix 155 and connect the electrically conductive structure 120 to an exterior surface 151, 152 of the magnetic inlay 150, where respective electrically conductive pads 126 are located. The electrically conductive vias 125 are configured as blind holes filled with electrically conductive material. The magnetic inlay 150 is configured so that, depending on the thickness and the shape of the electrically conductive structure 120, a specific inductance value is provided for the magnetic inlay 150. This inductance value can be adjusted based on the thickness and the shape of the electrically conductive structure 120. Further, the magnetic permeability of the magnetic matrix 155 can be chosen accordingly.

Figure 2:
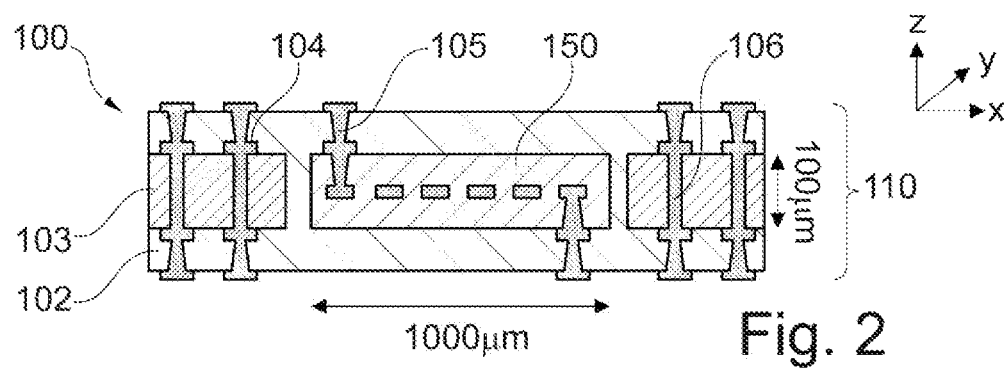
FIG. 2 shows a side view of a component carrier with the magnetic inlay according to an exemplary embodiment of the disclosure.

FIG. 2 shows a component carrier 100 according to an exemplary embodiment of the disclosure. The component carrier 100 comprises a layer stack 110 with electrically conductive layer structures 104 and electrically insulating layer structures 102. The center of the component carrier 100 constitutes an insulating core layer structure 103 (e.g., fully cured resin such as FR4). Electrically conductive through connections 106 in the form of vias extend through the core structure 103 to thereby electrically connect a first (top) main surface with an opposite second (bottom) main surface of the component carrier 100.

The above-described magnetic inlay 150 is embedded within the insulating core layer structure 103 and encapsulated with electrically insulating layer stack material 102. In the example shown, the magnetic inlay 150 is embedded so that main surfaces of the insulating core structure 103 and the magnetic inlay 150 are flush (both comprise a respective thickness of 100 μm). The component carrier 100 further comprises blind vias 105 that are electrically connected to the respective electrically conductive pads 126 of the magnetic inlay 150.

Figure 3:
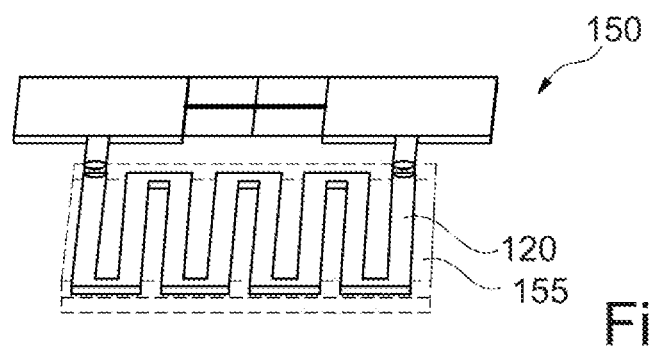
FIG. 3 shows a top view of the magnetic inlay according to an exemplary embodiment of the disclosure.

FIG. 3 shows a detailed view of a magnetic element 150 that comprises an inductive element 120 embedded in a magnetic matrix 155 according to an exemplary embodiment of the disclosure. It can be seen that the inductive element 120 is formed by an electrically conductive structure 120 (e.g., copper) winding that is formed in a rectangular coil-like manner. In the example shown, the element 120 comprises seven windings. A starting point and an end point of the windings 120 are respectively electrically connected to a terminal (in particular by the via 125). When an electric current is provided to the inductive element 120, an inductance is provided which is in turn enhanced by the magnetic permeability of the magnetic matrix 150. Since the magnetic element 150 comprises a planar shape, the electrically conductive structure 120 is oriented horizontally with respect to the component carrier 100. By providing the magnetic matrix 155, a large amount of magnetic material can be applied and, as a consequence, a high inductance value can be obtained.

Figure 4:
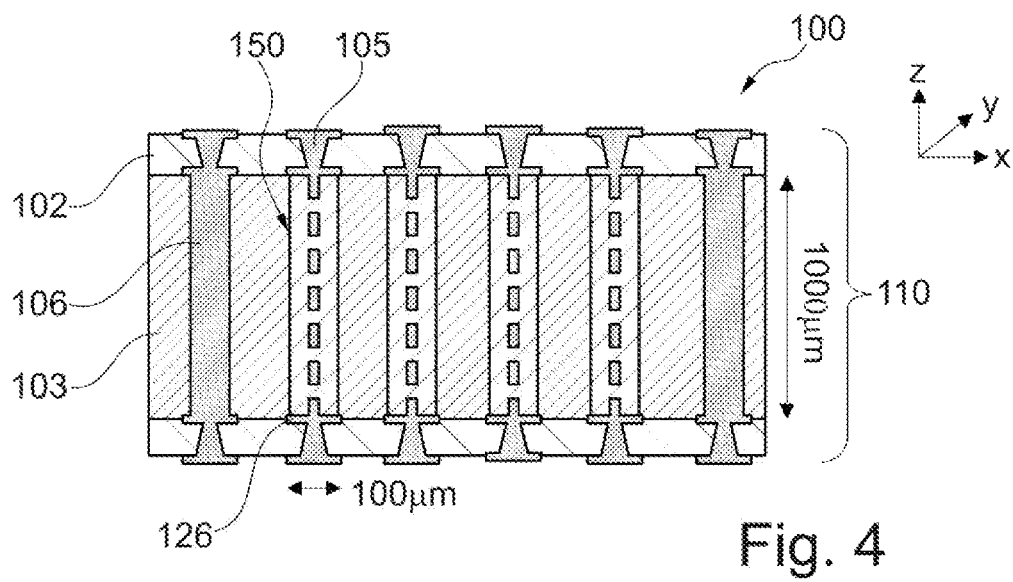
FIG. 4 shows a side view of a component carrier with the magnetic inlay according to another exemplary embodiment of the disclosure.

FIG. 4 shows a component carrier 100 according to another exemplary embodiment of the disclosure. While in FIG. 2 the magnetic inlay 150 is arranged horizontally in the component carrier 100 (i.e., the directions of main extension (along the indicated x and y axes) of the magnetic inlay 150 are oriented in parallel with the directions of main extension of the component carrier 100), there are a plurality of magnetic inlays 150 oriented vertically in the component carrier 100 (i.e., the direction of main extension (along the indicated x axis) of the magnetic inlay 150 is oriented perpendicular with the direction of main extension (x) of the component carrier 100). Electrically conductive pads 126 of the magnetic inlay 150 are electrically connected to respective blind vias 105 of the component carrier 100 along the z-direction. In the example shown, the magnetic inlays 150 are embedded in the insulating core layer structure 103 of the component carrier 100. The component carrier 100 further comprises through-hole vias 106 that are oriented in parallel with the embedded magnetic inlays 150. The magnetic inlays 150 can comprise a respective length of 1000 μm (same as the insulating core structure 103), so that exposed surfaces of the magnetic inlay 150 may be flush with the upper/lower main surface of the insulating core layer structure 103.

FIGS. 5A to 5A illustrate a manufacturing method to provide the magnetic inlay 150 according to an exemplary embodiment of the disclosure.

As shown in FIGS. 5A to 5C, a temporary carrier 170 is provided. A bottom first electrically conductive layer (copper foil) 128a is arranged to a first side (main surface) and a bottom second electrically conductive layer (copper foil) 128b is arranged to a second side (main surface) (being opposed to the first side) of a release film 171 to provide the temporary carrier 170.

As illustrated in FIG. 5D, a first magnetic element 150a is placed (bond treatment, lamination) on the first side of the temporary carrier 170, and a second magnetic element 160a is placed on the second side, being opposed to the first side, of the temporary carrier 170. Further, a first electrically conductive layer 121a is laminated structure on the first magnetic element 150a and a second electrically conductive layer structure 121b is laminated on the second magnetic element 160a.

As shown in FIG. 5e, the first electrically conductive layer 121a and the second electrically conductive layer 121b are structured (patterned) to yield the first electrically conductive structure 120a and the second electrically conductive structure 120b, respectively.

As illustrated in FIG. 5F, a further first magnetic element 150b is placed on the first magnetic element 150a, thereby enclosing the first electrically conductive structure 120a, and a further second magnetic element 160b is placed on the second magnetic element 160a, thereby enclosing the second electrically conductive structure 120b. A top first electrically conductive layer 127a is laminated on the further first magnetic element 150b, and a top second electrically conductive layer 127b is arranged on the further second magnetic element 160b.

As shown in FIG. 5G, a first magnetic inlay preform is separated from the first side of the temporary carrier 170 and a second magnetic inlay preform is separated from the second side of the temporary carrier 170 (not shown). The magnetic matrix 155 is sandwiched between the metal layers 127, 128.

As illustrated in FIG. 5H, blind holes are drilled through the metal layers (top/bottom electrically conductive layers) 127, 128 and the magnetic matrix 155 to expose the embedded electrically conductive structure 120. Then an electrically conductive via-contact is established from the magnetic inlay 150 surface to the embedded electrically conductive structure 120. In the example shown, the blind-hole is filled with electrically conductive material by copper plating to obtain filled vias 125.

As shown in FIG. 5I, the metal layers 127, 128 are patterned (in this particular example essentially removed) to generate electrically conductive pads 126 that can be used to electrically connect the inductive element 120, for example with a component carrier 100. Regions where the metal layers 127, 128 have been removed comprise a rough surface that reflects the manufacturing process. Since a plurality of magnetic inlays 150 may be produced in one panel, in a further step the panel can be diced to obtain the plurality of magnetic inlays 150.

FIGS. 6A and 6B show a manufacturing method to provide the magnetic inlay 150 according to another exemplary embodiment of the disclosure. In the example of FIG. 6A, copper foils 128a, 128b are arranged to the two opposed sides of a resin layer 172, e.g., a prepreg layer 172. Thereby, a respective smooth surface is oriented towards the prepreg layer 172 (pressed to the prepreg layer), while opposed rough (treated) surfaces are oriented away from the prepreg layer 172. Magnetic sheets 150a, 160a are then placed onto the rough copper surfaces, respectively. After a lamination step, the layer stack shown in FIG. 6B is provided (carrier films of the magnetic sheets have been removed). A further lamination step is then performed.

It should be noted that the term "comprising" does not exclude other elements or steps and the use of articles "a" or "an" does not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

REFERENCE SIGNS

100 Component carrier
102 Electrically insulating layer structure
103 Core layer structure
104 Electrically conductive layer structure
105 Component carrier blind via
106 Component carrier through via
110 Layer stack
120 Electrically conductive structure, inductive element
120a First electrically conductive structure
120b Second electrically conductive structure
121a First electrically conductive layer
121b Second electrically conductive layer
125 Magnetic inlay electrically conductive via
126 Magnetic inlay electrically conductive pad
127 Top electrically conductive layer, metal layer
127a Top first electrically conductive layer
127b Top second electrically conductive layer
128 Bottom electrically conductive layer, metal layer
128a Bottom first electrically conductive layer
128b Bottom second electrically conductive layer
150 Magnetic inlay
150a First magnetic element
150b Further first magnetic element
151 Upper main surface
152 Lower main surface
155 Magnetic matrix
160a Second magnetic element
160b Further second magnetic element
170 Temporary carrier
171 Electrically insulating layer, release film
172 Resin layer, prepreg layer
Rough surface R

The invention claimed is:

1. A magnetic inlay for a component carrier, the magnetic inlay comprising:
a magnetic matrix;
at least one electrically conductive structure embedded horizontally in the magnetic matrix,
wherein the at least one electrically conductive structure is a structured electrically conductive layer,
wherein the electrically conductive structure is configured as an inductive element;
wherein the magnetic inlay is configured such that, depending on the geometrical properties of the electrically conductive structure, a specific inductance value is provided in the range 10 to 10000 $nH/mm^2$ for the magnetic inlay.

2. The magnetic inlay according to claim 1,
wherein an upper main surface and/or a lower main surface, being opposed to the upper main surface, of the magnetic matrix comprises a rough surface that reflects a manufacturing step of arranging an electrically conductive layer on the magnetic matrix.

3. The magnetic inlay according to claim 1,
wherein the magnetic inlay is shaped as a plate with a planar shape.

4. The magnetic inlay according to claim 1,
wherein the magnetic inlay comprises a thickness of 200 μm or less; and/or
wherein the magnetic inlay comprises a thickness in the range 20 μm to 2 mm.

5. The magnetic inlay according to claim 1,
wherein the electrically conductive structure is arranged in the center of the magnetic inlay with respect to the vertical direction.

6. The magnetic inlay according to claim 1,
wherein the electrically conductive structure comprises windings with a number of windings or turns in the range between two and one hundred.

7. The magnetic inlay according to claim 6,
wherein the windings of the electrically conductive structure comprise at least one of a rectangular shape, a round shape, a polygonal shape, a spiral shape, a combined rectangular spiral shape.

8. The magnetic inlay according to claim 1, wherein the magnetic inlay further comprises:
at least one electrically conductive via, being a blind via or a through-hole via, that extends at least partially through the magnetic matrix, and that connects the electrically conductive structure to an exterior surface of the magnetic inlay;
wherein the at least one electrically conductive via is filled at least partially with electrically conductive material, or
wherein the at least one electrically conductive via is a hollow lining which is filled at least partially with an electrically insulating material.

9. The magnetic inlay according to claim 1, wherein the magnetic matrix comprises at least one of the following features:
wherein the magnetic matrix continuously fills a volume around the electrically conductive structure;
wherein the magnetic matrix comprises at least one of the group consisting of a rigid solid, and a paste;
wherein the magnetic matrix comprises one of the group which consists of: electrically conductive, electrically insulating, partially electrically conductive and partially electrically insulating;
wherein the relative magnetic permeability μr of the magnetic matrix is in a range from 2 to $10^6$,
wherein the magnetic matrix comprises at least one material of the group consisting of a ferromagnetic material, a ferrimagnetic material, a permanent magnetic material, a soft magnetic material, a ferrite, a metal oxide, a dielectric matrix, a prepreg, with magnetic particles therein, and an iron alloy or alloyed silicon.

10. A component carrier, comprising:
a stack comprising at least one electrically conductive layer structure and/or at least one electrically insulating layer structure;
a magnetic inlay assembled to the stack; the magnetic inlay comprising:
  a magnetic matrix;
  at least one electrically conductive structure embedded horizontally in the magnetic matrix, wherein the at least one electrically conductive structure is a structured electrically conductive layer, wherein the electrically conductive structure is configured as an inductive element;
  wherein the geometrical properties of the electrically conductive structure provide a specific inductance value in the range 10 to 10000 $nH/mm^2$.

11. The component carrier according to claim 10,
wherein the magnetic inlay is embedded in the stack; or
wherein the magnetic inlay is surface mounted on the stack.

12. The component carrier according to claim 10,
wherein at least one electrically conductive structure of the stack is electrically connected to the electrically conductive structure of the magnetic inlay by at least one electrically conductive via to the stack.

13. The component carrier according to claim 10,
wherein the magnetic inlay is assembled to the stack, so that the directions of main extension of the magnetic inlay are essentially parallel to the directions of main extension of the component carrier.

14. The component carrier according to claim 10,
wherein the magnetic inlay is assembled to the stack, so that a direction of main extension of the magnetic inlay is essentially perpendicular to a direction a main extension of the component carrier.

15. A method of manufacturing a magnetic inlay for a component carrier, the method comprising:
providing a temporary carrier;
arranging a first magnetic element on a first side of the temporary carrier;
arranging a second magnetic element on a second side, being opposed to the first side, of the temporary carrier;
arranging a first electrically conductive structure on the first magnetic element;
arranging a second electrically conductive structure on the second magnetic element;
wherein at least one of the first electrically conductive structure and the second electrically conductive structure is a patterned electrically conductive layer;
arranging a further first magnetic element on the first magnetic element, thereby enclosing the first electrically conductive structure in a first magnetic matrix;
arranging a further second magnetic element on the second magnetic element, thereby enclosing the second electrically conductive structure in a second magnetic matrix;
separating a first magnetic inlay from the first side of the temporary carrier; and
separating a second magnetic inlay from the second side of the temporary carrier,
wherein the respective geometrical properties of the first electrically conductive structure and the second electrically conductive structure provide a respective specific inductance value.

16. The method according to claim 15, further comprising:
arranging a top electrically conductive layer on the further first magnetic element; and/or
arranging a top second electrically conductive layer on the further second magnetic element.

17. The method according to claim 16, wherein arranging comprises structuring by
removing electrically conductive material, thereby exposing an upper main surface of the respective magnetic element,
wherein the upper main surface of the respective magnetic element comprises a rough surface.

18. The method according to claim 15,
wherein the temporary carrier comprises a bottom first electrically conductive layer at the first side and/or a bottom second electrically conductive layer at the second side, wherein the temporary carrier comprises an electrically insulating layer or a release film, sandwiched between the bottom first electrically conductive layer and the bottom second electrically conductive layer.

19. A method of adjusting the inductance of a magnetic inlay for a component carrier to a specific inductance value, the method comprising:
providing a first magnetic element with a first magnetic matrix;
providing an electrically conductive structure that is configured as an inductive element, hereby determining specific geometrical properties for the electrically conductive structure that correspond to an inductance value in the range 10 to 10000 $nH/mm^2$;
arranging the electrically conductive structure on or in the first magnetic element, wherein the at least one electrically conductive structure is a structured electrically conductive layer;
arranging a second magnetic element with a second magnetic matrix, on the first magnetic element, thereby enclosing the electrically conductive structure in magnetic material to obtain the magnetic inlay with the specific inductance value.

20. The method according to claim 19, wherein providing the first magnetic element and/or the second magnetic element further comprises:
determining a specific magnetic permeability for the first magnetic element and/or the second magnetic element in order to obtain the magnetic inlay with the specific inductance value.

* * * * *